(12) United States Patent  
Grant et al.

(10) Patent No.: US 7,616,669 B2  
(45) Date of Patent: Nov. 10, 2009

(54) HIGH ENERGY PULSE SUPPRESSION METHOD

(75) Inventors: Keith Grant, Beaverton, OR (US); Steve Stone, Seattle, WA (US); Brady Nilsen, Beaverton, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 445 days.

(21) Appl. No.: 10/997,586

(22) Filed: Nov. 24, 2004

(65) Prior Publication Data

US 2005/0100062 A1 May 12, 2005

Related U.S. Application Data

(63) Continuation-in-part of application No. 10/611,798, filed on Jun. 30, 2003, now Pat. No. 6,947,454.

(51) Int. Cl.  
*H01S 3/11* (2006.01)

(52) U.S. Cl. .............................. 372/10; 372/90; 372/26; 372/92

(58) Field of Classification Search ............... 372/9–13, 372/17, 25, 30, 26, 90, 92; 219/121.6, 121.62, 219/121.85, 181.82  
See application file for complete search history.

(56) References Cited

U.S. PATENT DOCUMENTS

| | | | |
|---|---|---|---|
| 3,480,368 A * | 11/1969 | Aas et. al. ................... | 356/400 |
| 3,688,388 A * | 9/1972 | Dyment et al. ............... | 438/33 |
| 4,176,327 A * | 11/1979 | Wayne et al. ................. | 372/18 |
| 4,930,901 A | 6/1990 | Johnson et al. ............... | 372/26 |
| 5,041,716 A | 8/1991 | Wakabayashi et al. . | 219/121.68 |
| 5,197,074 A | 3/1993 | Emmons, Jr. et al. ......... | 372/26 |
| 5,226,051 A | 7/1993 | Chan et al. .................... | 372/30 |
| 5,265,114 A | 11/1993 | Sun et al. ...................... | 372/69 |
| 5,347,392 A | 9/1994 | Chen et al. ................... | 359/279 |
| 5,509,022 A | 4/1996 | Lowery et al. ................ | 372/18 |
| 5,590,141 A | 12/1996 | Baird et al. ................... | 372/10 |

(Continued)

FOREIGN PATENT DOCUMENTS

WO        98/53949        12/1998

(Continued)

OTHER PUBLICATIONS

Wang,Y. et al., "Pulse Selection from a Mode-Locked TE $CO_2$ Laser Output Using a Resonant Acousto-Optic Modulator" Proc. SPIE—Int. Soc. Opt. Eng. (USA), vol. 3268, Jan. 27, 1998, pp. 70-80.

(Continued)

*Primary Examiner*—Minsun Harvey  
*Assistant Examiner*—Delma R Forde  
(74) *Attorney, Agent, or Firm*—Stoel Rives LLP

(57) ABSTRACT

A laser processes a workpiece with laser pulses delivered at random time intervals and at substantially constant energy levels by characterizing the laser cavity discharge behavior and utilizing that information for adjusting dummy pulse time periods to compensate for the energy errors. Dummy pulses are laser pulses that are blocked from reaching a workpiece. A second way for providing constant pulse energies employs an AOM for varying amounts of laser energy passed to the workpiece. A third way of providing constant pulse energies entails extending the pulse period of selected pulses to allow additional laser cavity charging time whenever a dummy pulse is initiated.

26 Claims, 7 Drawing Sheets

U.S. PATENT DOCUMENTS

| | | | |
|---|---|---|---|
| 5,748,655 A | 5/1998 | Yessik et al. | 372/22 |
| 5,751,585 A | 5/1998 | Cutler et al. | 364/474.03 |
| 6,057,180 A | 5/2000 | Sun et al. | 438/132 |
| 6,172,325 B1 | 1/2001 | Baird et al. | 219/121.62 |
| 6,197,133 B1 | 3/2001 | Unternahrer et al. | |
| 6,339,604 B1 | 1/2002 | Smart | 372/26 |
| 6,559,412 B2 | 5/2003 | Lauer et al. | 219/121.69 |
| 6,574,250 B2 | 6/2003 | Sun et al. | 372/25 |
| 6,593,542 B2 | 7/2003 | Baird et al. | 219/121.67 |
| 6,781,090 B2 | 8/2004 | Sun et al. | 219/121.7 |
| 6,784,399 B2 | 8/2004 | Dunsky et al. | 219/121.69 |
| 6,806,440 B2 | 10/2004 | Sun et al. | |
| 6,947,454 B2 | 9/2005 | Sun et al. | 372/26 |
| 7,227,098 B2 * | 6/2007 | Bruland et al. | 219/121.69 |
| 7,301,981 B2 | 11/2007 | Sun et al. | |
| 7,348,516 B2 | 3/2008 | Sun et al. | 219/121.61 |
| 2002/0167581 A1 | 11/2002 | Cordingley et al. | 347/173 |
| 2004/0202207 A1 * | 10/2004 | Wang | 372/10 |
| 2005/0100062 A1 * | 5/2005 | Grant et al. | 372/10 |
| 2005/0224469 A1 | 10/2005 | Cutler et al. | |
| 2006/0027540 A1 * | 2/2006 | Bruland et al. | 219/121.61 |
| 2007/0228024 A1 | 10/2007 | Bruland et al. | |

FOREIGN PATENT DOCUMENTS

| | | |
|---|---|---|
| WO | WO 03/052890 | 6/2003 |
| WO | WO 2005/006422 | 1/2005 |

OTHER PUBLICATIONS

Balakshy, V. et al., Compensation of Thermal Effects in Acousto-Optic Deflector Proc. SPIE—Int. Soc. Opt. Eng. (USA), vol. 2713, Jun. 26, 1995, pp. 164-171.

* cited by examiner

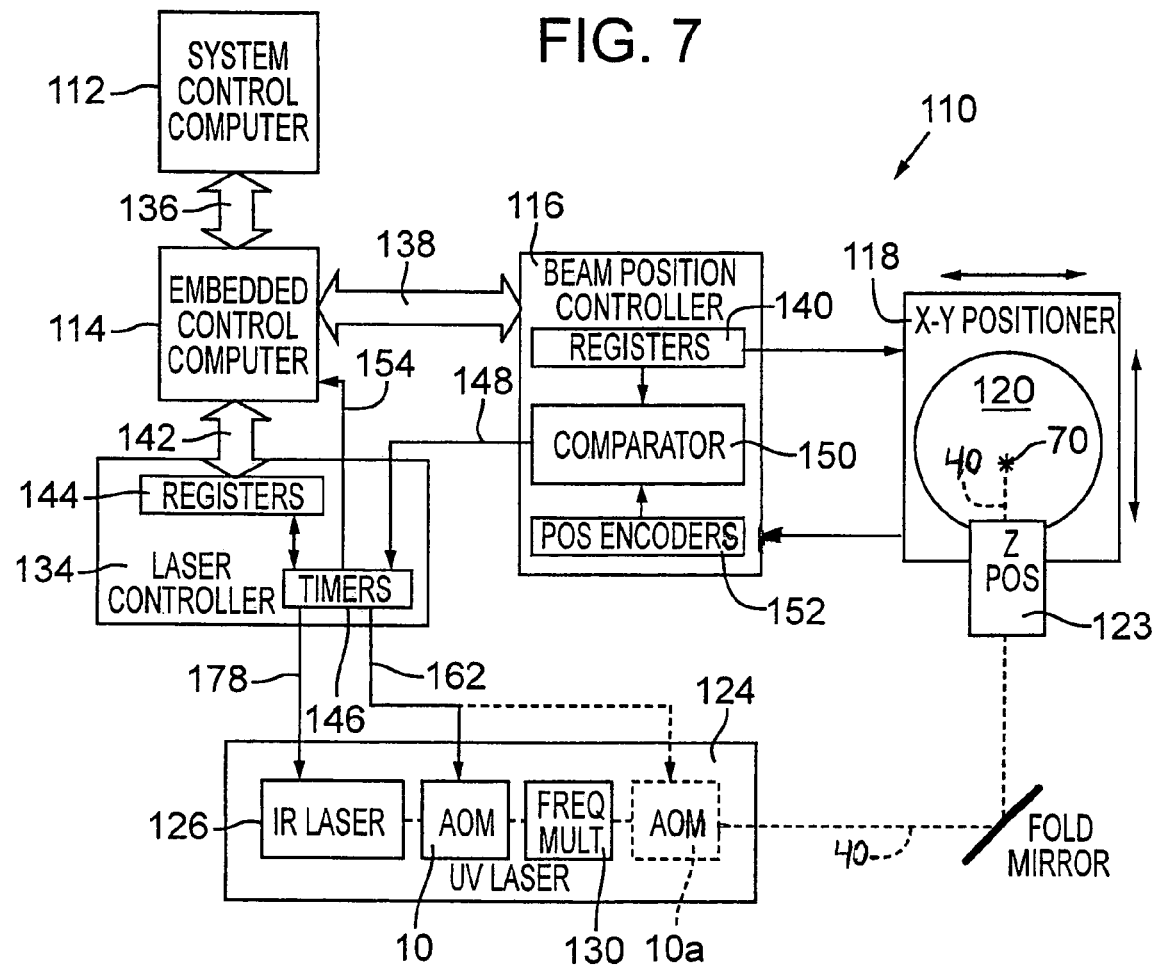

HIGH ENERGY PULSE SUPPRESSION METHOD

RELATED APPLICATION

This application is a continuation-in-part of U.S. patent application Ser. No. 10/611,798, filed Jun. 30, 2003 now U.S. Pat. No. 6,947,454, for LASER PULSE PICKING EMPLOYING CONTROLLED AOM LOADING.

TECHNICAL FIELD

This invention relates to lasers and, more particularly, to a method and an apparatus for providing high repetition rate, stable energy laser pulses on demand with a load controlled acousto-optic modulator ("AOM") to minimize distortion of the quality or positional accuracy of the laser beam.

BACKGROUND OF THE INVENTION

Lasers are widely employed in a variety of R & D operations including spectroscopic and biotech study and industrial operations including inspecting, processing, and micromachining a variety of electronic materials and substrates. For example, to repair a dynamic random access memory ("DRAM"), laser pulses are used to sever electrically conductive links to disconnect faulty memory cells from a DRAM device, and then to activate redundant memory cells to replace the faulty memory cells. Because faulty memory cells needing link removals are randomly located, the links that need to be severed are located randomly. Thus, during the laser link repairing process, the laser pulses are fired at random pulse intervals. In other words, the laser pulses are running at a wide variable range of pulse repetition frequencies ("PRF"s), rather than at a constant PRF. For industrial processes to achieve greater production throughput, the laser pulse is fired at the target link without stopping the laser beam scanning mechanism. This production technique is referred to in the industry as "on-the-fly" ("OTF") link processing. Other common laser applications employ laser pulses that are fired only when they are needed at random time moments.

However, the laser energy per pulse typically decreases with increasing PRF while laser pulse width increases with increasing PRF, characteristics that are particularly true for Q-switched, solid-state lasers. While many laser applications require randomly time-displaced laser pulses on demand, these applications also require that the laser energy per pulse and the pulse width be kept substantially constant. For link processing on memory or other IC chips, inadequate laser energy will result in incomplete link severing, while too much laser energy will cause unacceptable damage to the passivation structure or the silicon substrate. The acceptable range of laser pulse energies is often referred to as a "process window." For many practical IC devices, the process window requires that laser pulse energy vary by less than 5% from a selected pulse energy value.

Skilled persons have taken various approaches for ensuring operation within a process window or for expanding the process window. For example, U.S. Pat. No. 5,590,141 for METHOD AND APPARATUS FOR GENERATING AND EMPLOYING A HIGH DENSITY OF EXCITED IONS IN A LASANT, which is assigned to the assignee of this patent application, describes solid-state lasers having lasants exhibiting a reduced pulse energy drop off as a function of PRF and, therefore, a higher usable PRF. Such lasers are, therefore, capable of generating more stable pulse energy levels when operated below their maximum PRF. U.S. Pat. No. 5,265,114 for SYSTEM AND METHOD FOR SELECTIVELY LASER PROCESSING A TARGET STRUCTURE OF ONE OR MORE MATERIALS OF A MULTIMATERIAL, MULTILAYER DEVICE, which is also assigned to the assignee of this patent application, describes using a longer laser wavelength such as 1,320 nanometers ("nm") to expand the link process window to permit a wider variation of the laser pulse energy during the process. U.S. Pat. No. 5,226,051 for LASER PUMP CONTROL FOR OUTPUT POWER STABILIZATION describes a technique of equalizing the laser pulse energy by controlling the current of the pumping diodes. The technique works well in practical applications employing a laser PRF below about 25 KHz or 30 KHz.

The above-described laser processing applications typically employ infrared ("IR") lasers having wavelengths from 1,047 nm to 1,342 nm, running at a PRF not over about 25 or 30 KHz. However, production needs are demanding much higher throughput, so lasers should be capable of operating at PRFs much higher than about 25 KHz, such as 50-60 KHz or higher. In addition, many laser processing applications are improved by employing ultraviolet ("UV") energy wavelengths, which are typically less than about 400 nm. Such UV wavelengths may be generated by subjecting an IR laser to a harmonic generation process that stimulates the second, third, or fourth harmonics of the IR laser. Unfortunately, due to the nature of the harmonic generation, the pulse-to-pulse energy levels of such UV lasers are particularly sensitive to time variations in PRF and laser pulse interval.

U.S. Pat. No. 6,172,325 for LASER PROCESSING POWER OUTPUT STABILIZATION APPARATUS AND METHOD EMPLOYING PROCESSING POSITION FEEDBACK, which is also assigned to the assignee of this patent application, describes a technique of operating the laser at a constant high repetition rate in conjunction with a position feedback-controlled laser pulse picking or gating device to provide laser pulse picking on demand, at random time interval that is a multiple of the laser pulse interval, with good laser pulse energy stability and high throughput.

Typical laser pulse picking or gating devices include an acousto-optic modulator ("AOM") and an electro-optic modulator ("EOM"), also referred to as a Pockets cell. Typical EOM material such as KD*P or KDP suffers from relatively strong absorption at the UV wavelengths, which results in a lower damage threshold of the material at the wavelength used and local heating of optical devices positioned along the laser beam path within the gating device and thereby causes changes in the voltage required by the modulator to effect one-half wavelength retardation. Another disadvantage of the EOM is its questionable ability to perform well at a repetition rate over 50 KHz. AOM material is, on the other hand, quite transparent to the UV of 250 nm up to the IR of 2,000 nm, which allows the AOM to perform well throughout typical laser wavelengths within the range. An AOM can also easily accommodate the desirable gating of pulses at a repetition rate of up to a few hundred KHz. One disadvantage of the AOM is its limited diffraction efficiency of about 75-90%.

FIG. 1 shows a typical prior art AOM 10 driven by a radio frequency ("RF") driver 12 and employed for a laser pulse picking or gating application, and FIGS. 2A to 2D (collectively, FIG. 2) show corresponding prior art timing graphs for incoming laser pulses 14, AOM RF pulses 15, and AOM output pulses 16 and 20. FIG. 2A shows constant repetition rate laser pulses 14a-14k that are emitted by a laser (not shown) and propagated to AOM 10. FIG. 2B demonstrates two exemplary schemes for applying RF pulses 15 to AOM 10 to select which ones of laser pulses 14a-14k, occurring at corresponding time periods 22a-22k, are propagated toward a target. In a first scheme, a single RF pulse 15cde (shown in dashed lines) is extended to cover time periods 22c-22e corresponding to laser pulses 14c, 14d, and 14e; and, in a second scheme, separated RF pulses 15c, 15d, and 15e are generated to individually cover the respective time periods 22c, 22d, and 22e for laser pulses 14c, 14d, and 14e. FIGS. 2C and 2D show the respective first order beam 20 and zero order beam 16 propagated from AOM 10, as determined by the presence or absence of RF pulses 15 applied to AOM 10.

Referring to FIGS. 1 and 2, AOM 10 is driven by RF driver 12. When no RF pulses 15 are applied to AOM 10, incoming laser pulses 14 pass through AOM 10 substantially along their original beam path and exit as beam 16, typically referred to as the zero order beam 16. When RF pulses 15 are applied to AOM 10, part of the energy of incoming laser pulses 14 is diffracted from the path of the zero order beam 16 to a path of a first order beam 20. AOM 10 has a diffraction efficiency that is defined as the ratio of the laser energy in first order beam 20 to the laser energy in incoming laser pulses 14. Either first order beam 20 or zero order beam 16 can be used as a working beam, depending on different application considerations. For simplicity, laser pulses 14 entering AOM 10 will hereafter be referred as "laser pulses" or "laser output," and pulses delivered to the target, because they are picked by AOM 10, will be referred to as "working laser pulses" or "working laser output."

When the first order beam is used as the working beam, the energy of the working laser pulses can be dynamically controlled from 100% of its maximum value down to substantially zero, as the RF power changes from its maximum power to substantially zero, respectively. Because the practical limited diffraction efficiency of an AOM 10 under an allowed maximum RF power load is about 75% to 90%, the maximum energy value of the working laser pulses is about 75-90% of the laser pulse energy value from the laser. However, when the zero order beam 16 is used as the working beam, the energy of the working laser pulses can be dynamically controlled from 100% of the maximum value of the laser pulse energy from the laser down to 15-20% of the maximum value, as the RF power changes from substantially zero to its maximum power, respectively. For memory link processing, for example, when the working laser pulse is not on demand, no leakage of system laser pulse energy is permitted, i.e., the working laser pulse energy should be zero so the first order laser beam 20 is used as the working beam.

With reference again to FIG. 2, RF pulses 15 are applied to AOM 10 at random time intervals and only when working laser pulses are demanded, in this case, at random integral multiples of the laser pulse interval. The random output of working laser pulses results in random variable thermal loading on AOM 10. Variable thermal loading causes geometric distortion and temperature gradients in AOM 10, which cause gradients in its refractive index. The consequences of thermal loading distort a laser beam passing through AOM 10, resulting in deteriorated laser beam quality and instability in the laser beam path or poor beam positioning accuracy. These distortions could be corrected to some degree if they could be kept constant. However, when the system laser pulses are demanded randomly, such as in laser link processing, these distortions will have the same random nature and cannot be practically corrected.

Test results on an AOM device, such as a Model N23080-2-1.06-LTD, made by NEOS Technologies, Melbourne, Fla., showed that with only 2 W RF power, the laser beam pointing accuracy can deviate as much as 1 mrad when the RF to the AOM 10 is applied on and off randomly. This deviation is a few hundred times greater than the maximum allowed for the typical memory link processing system. Laser beam quality distortion due to the random thermal loading on the AOM 10 will also deteriorate the focusability of the laser beam, resulting in a larger laser beam spot size at the focusing point. For applications such as the memory link processing that require the laser beam spot size to be as small as possible, this distortion is very undesirable.

What is needed, therefore, is an apparatus and a method for randomly picking working laser pulses from a high repetition rate laser pulse train without causing distortion to the laser beam quality and positioning accuracy due to the random thermal loading variation on the AOM. What is also needed is an apparatus and method of generating working laser pulses having constant laser energy per pulse and constant pulse width on demand and/or on-the-fly at a high PRF and with high accuracy at vastly different pulse time intervals for a variety of laser applications such as spectroscopic, bio-tech, or micromachining applications, including laser link processing on memory chips.

SUMMARY OF THE INVENTION

An object of this invention is, therefore, to provide an apparatus and a method for picking laser pulses on demand from a high repetition rate pulsed laser.

Another object of this invention is to perform such pulse picking with minimal thermal loading variation on the AOM to minimize distortion to laser beam quality and positioning accuracy.

A further object of this invention is to provide an apparatus and a method for generating system laser pulses on demand, having stable pulse energies and stable pulse widths at selected wavelengths from the UV to near IR and at high PRF's for high-accuracy laser processing applications, such as memory link severing.

The present invention uses a laser with high repetition rate pulsed output in cooperation with an extra-cavity AOM device for picking or gating the laser pulses such that selected laser pulses are transmitted to the target on demand, while the rest of the laser pulses are blocked. Instead of applying the RF pulses to the AOM only when the working laser pulses are demanded as is done in the prior art, RF pulses with substantially similar pulse interval times, such as those of the laser pulses, are applied to the AOM regardless of whether a working laser pulse is demanded. Whenever a working laser pulse is demanded, the RF pulse is applied in coincidence with the corresponding laser pulse. Whenever a working laser pulse is not demanded, an RF pulse is also applied to the AOM, but in non-coincidence with the corresponding laser pulse. The RF pulse in noncoincidence with the laser pulse preferably has the same RF power and duration time as does the RF pulse in coincidence with the laser pulse. The timing shifting between noncoincident RF pulses and the laser pulses is small enough so that the time shifts are substantially negligible in terms of thermal loading on the AOM. Thus, the AOM will experience substantially no thermal loading variation regardless of how randomly the working laser pulses are demanded.

In a preferred embodiment, the working laser pulses are picked or gated from laser pulses generated at a constant high repetition rate or at a constant laser pulse interval. Such working laser pulses have high stability and consistency in their energy and pulse width.

Similarly, the AOM is operated at a substantially constant RF power loading or constant thermal loading regardless of how randomly the working laser pulses are demanded. So, there is substantially no adverse effect on the working laser beam quality and its pointing accuracy due to having a randomly transmissive AOM.

The RF pulse power can also be controlled to perform working laser pulse energy control with the same AOM device to suit application needs. To avoid an adverse effect on the working laser beam quality due to the random variation of the RF pulse power for performing laser pulse energy control, the RF pulse duration can be modulated accordingly such that the product of the RF pulse power and the RF pulse duration remains substantially constant, or an additional RF pulse can be added such that the total RF energy applied to the AOM during one laser pulse interval remains substantially constant.

If the workpiece processing application requires laser pulses to be delivered at random time intervals, some action needs to be taken to ensure that the energy per pulse is within the desired tolerance. A first preferred way of providing accurate pulse energies entails pulse period compensation, which includes characterizing the incomplete cavity discharge behavior and utilizing that information for adjusting time period Td to compensate for the energy errors.

A second preferred way of providing accurate pulse energies entails pulse height compensation, which employs the AOM for varying an amount of laser energy that is allowed to pass through to the workpiece.

A third preferred way of providing accurate pulse energies entails RF window compensation, which entails extending the Q-switch signal time period to allow additional energy to be emitted from the laser cavity whenever a dummy pulse is initiated. A 'dummy pulse' is referred to herein as a laser pulse emitted with the AOM blocked. The dummy pulse includes an extended time period for discharging extra energy from the cavity such that a cavity charging time period Tc results in a pulse energy level of the desired amount.

A fourth preferred of providing accurate pulse energies entails laser pumping compensation, which entails reducing the pumping current to the laser prior to the emission of a working pulse. Selecting a precharacterized pumping current based on pulse timing requirements reduces the rate of energy buildup in the lasing medium such that the emitted real pulse has an energy level of the desired amount.

This invention is advantageous for generating stable pulse-to-pulse working laser pulse energy for applications that ordinarily require randomly shutting the laser pulse on or off, including applications like IC chip link severing. This invention is also advantageous for stabilizing the working laser pulse-to-pulse energy of a Q-switched solid-state laser that employs a nonlinear harmonic generation process to produce frequency-doubled, -tripled, or -quadrupled laser pulses, in which the working laser pulses are randomly shut on and off.

This invention is advantageous for typical AOM materials, such as fused quartz and tellurium dioxide ($TeO_2$) used in the previously mentioned AOM Model N23080-2-1.06-LTD, that are quite transparent to laser wavelengths in a broad spectral range, from the UV spectrum to near IR, such as from 250 nm to 2,000 nm. In a preferred embodiment, the first order beam is employed as the working beam; however, for some applications, if 15-10% leakage of the laser pulse energy does not cause problems, then either the first order or the zero order beam can be used as the working beam.

Additional aspects and advantages of this invention will be apparent from the following detailed description of preferred embodiments, which proceeds with reference to the accompanying drawings.

BRIEF DESCRIPTION OF THE DRAWINGS

FIG. 7 is a schematic block diagram showing a preferred embodiment of an exemplary laser system employing a consistently thermally loaded AOM to provide stable pulse-to-pulse UV laser energy on demand to process unevenly spaced links selected for removal.

DETAILED DESCRIPTION OF PREFERRED EMBODIMENTS

Figure 1:
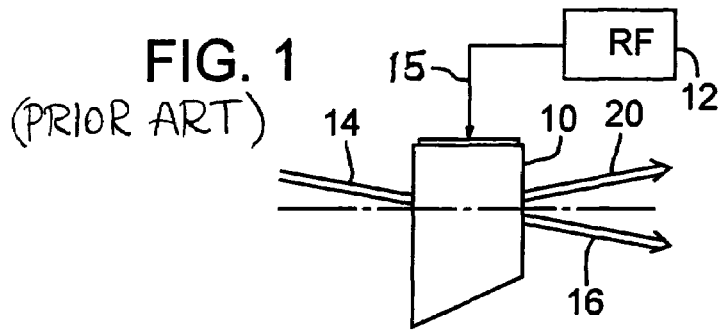
FIG. 1 is a partly schematic view of a prior art AOM device and an RF driver, transmitting zero order and/or first order beams.
Figure 2A:
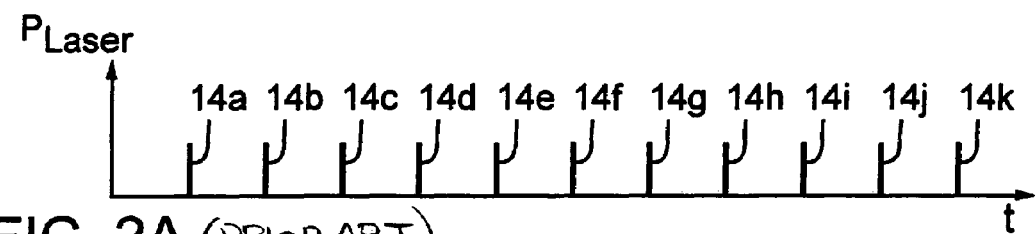
FIGS. 2A-2D are corresponding prior art timing graphs of laser pulses, RF pulses, and first and zero order AOM output laser pulses.
Figure 2B:
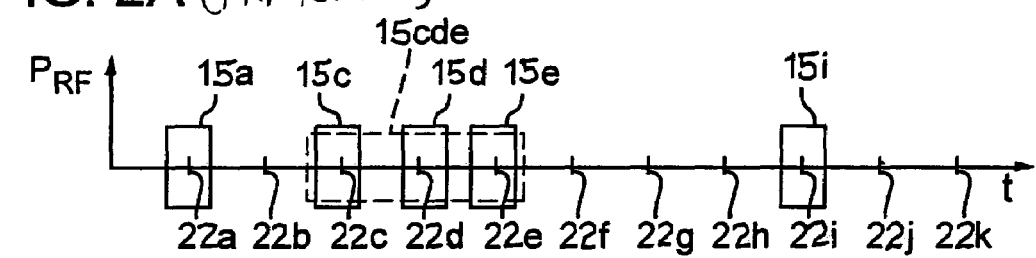
Figure 2C:
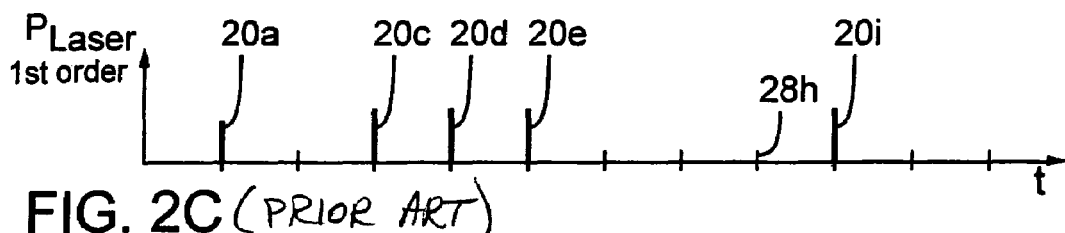
Figure 2D:
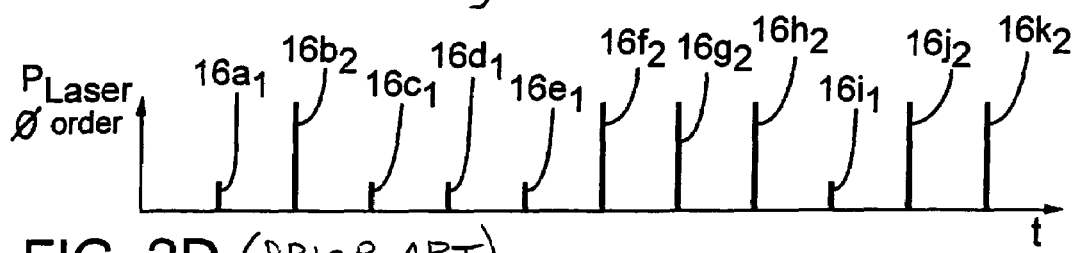
Figure 3A:
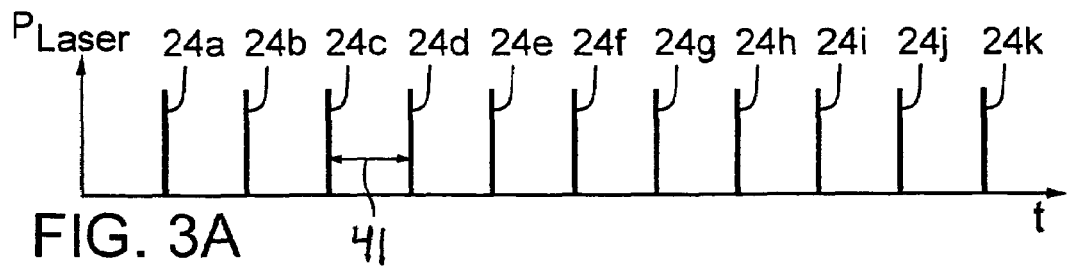
FIGS. 3A-3C are corresponding exemplary timing graphs of laser outputs, RF pulses, and working laser outputs as employed in a preferred embodiment.
Figure 3B:
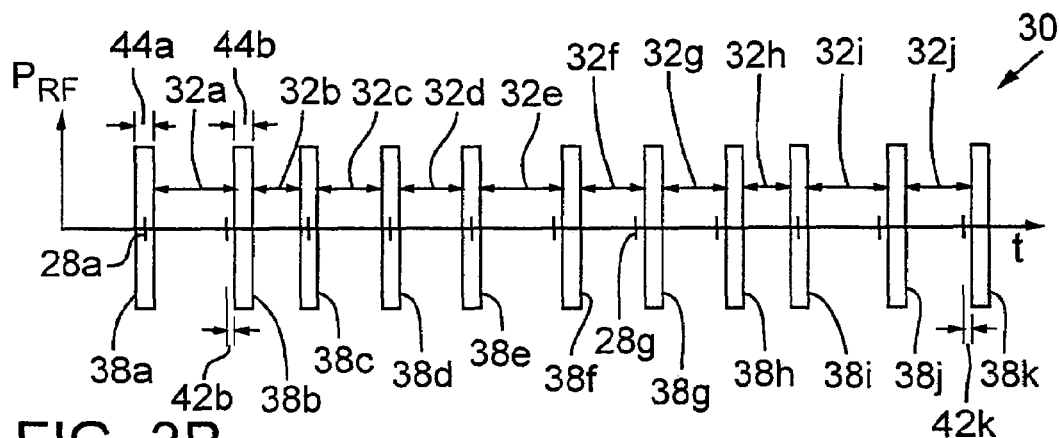
Figure 3C:
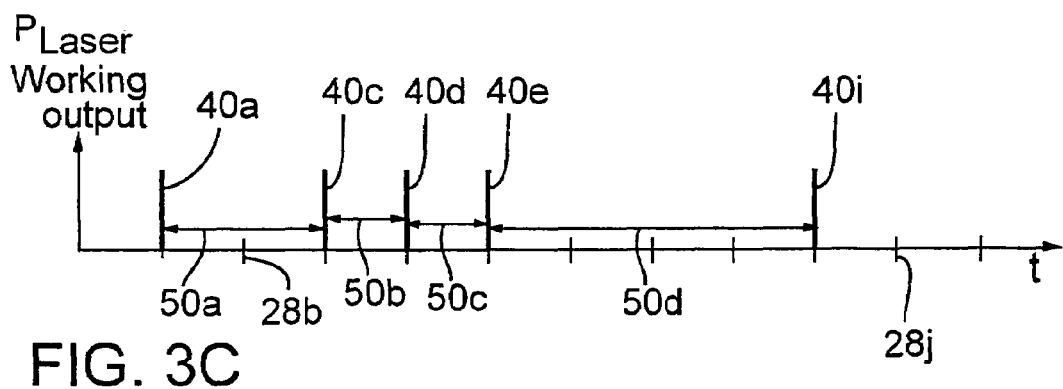

FIGS. 3A-3C (collectively, FIG. 3) show corresponding timing graphs of laser outputs 24a-24k (collectively, laser outputs 24), occurring at corresponding time periods 28a-28k, RF pulses 38a-38k (collectively, RF pulses 38) applied to prior art AOM 10, and working laser outputs 40a, 40c, 40d, 40e, and 40i (collectively, working laser outputs 40). In particular, FIG. 3A shows laser outputs 24a-24k that are emitted by a laser (not shown) at a constant repetition rate and separated by substantially identical laser output intervals 41. In typical embodiments, the laser output repetition rate may range from about 1 KHz up to about 500 KHz. Exemplary laser output repetition rates range from about 25 KHz to greater than about 100 KHz. For link processing embodiments, each of working laser outputs 40 preferably includes a single laser pulse having a multiple nanosecond pulse width. However, skilled persons will recognize that each of working laser outputs 40 may include a burst of one or more laser pulses each having an ultrashort pulse width, such as disclosed in U.S. Pat. No. 6,574,250 for LASER SYSTEM AND METHOD FOR PROCESSING A MEMORY LINK WITH A BURST OF LASER PULSES HAVING ULTRASHORT PULSE WIDTHS, which is assigned to assignee of this application, or bursts of one or more pulses having pulse widths ranging from about 10 picoseconds to about 1,000 picoseconds.

FIG. 3B shows a preferred embodiment of an RF pulsing scheme 30 that employs RF pulses 38 separated by RF pulse intervals 43a-43j (generically RF pulse intervals 43) that are substantially regular or uniform to maintain variations of thermal loading on AOM 10 to within a preassigned operational tolerance. Such tolerance may be a specific thermal load window, but the preassigned tolerance may also or alternatively be windows of spot size or beam position accuracy. In one embodiment, the thermal loading variation is maintained within 5% and/or the beam pointing accuracy is maintained within 0.005 mrad. In a preferred embodiment, at least one RF pulse 38 is generated to correspond with each laser output 24.

Whenever a working laser output 40 is demanded to impinge a target such as an electrically conductive link 60 (FIG. 6A), an RF pulse 38 is applied to AOM 10 in coincidence with a laser output 24 such that it is transmitted through AOM 10 and becomes a working laser output 40.

In FIG. 3B, the coincident RF pulses 38 are RF pulses 38a, 38c, 38d, 38e, and 38i. FIG. 3C shows the resulting corresponding working laser outputs 40a, 40c, 40d, 40e, and 40i. When no working laser output is demanded to correspond with laser outputs 24, RF pulses 38 are applied to AOM 10 in noncoincidence with corresponding ones of laser outputs 24. In FIG. 3B, the noncoincident RF pulses 38 are RF pulses 38b, 38f, 38g, 38h, 38j, and 38k. FIG. 3C shows that no working laser outputs 40 correspond with noncoincident RF pulses 38.

The noncoincident RF pulses 38 are preferably offset from the initiations of respective laser outputs 24 by time offsets 44 that are longer than about 0.5 microsecond. Skilled persons will appreciate that while time offsets 44 are shown to follow laser outputs 24, time offsets 44 could alternatively precede laser outputs 24 by a sufficient time to prevent targeting of laser working outputs 40. Thus, RF pulse intervals 43 surrounding one of noncoincident RF pulses 38 may be shorter (such as RF pulse intervals 43b and 43h than the overall average RF pulse interval 43 (such as 43c, 43d, 43f, 43g, and 43i) or longer (such as RF pulse intervals 43a, 43e, and 43j) than the average RF pulse intervals 43.

With reference again to FIG. 3C, nonimpingement intervals 46b and 46c between working laser outputs 40c and 40d and between working laser outputs 40d and 40e, respectively, are about the same as the laser output interval 41. The nonimpingement intervals 46a and 46d between working laser outputs 40a and 40c and between working laser outputs 40e and 40j, respectively, are roughly integer multiples of the laser output interval 41 (FIG. 3A).

Skilled persons will appreciate that even though the working laser output 40 is preferably the first order beam 20 for most applications, such as link processing, the working laser output 40 may be the zero order beam 16 where leakage is tolerable and higher working laser output power is desirable.

In a preferred embodiment, the coincident and noncoincident RF pulses 38 not only employ about the same RF energy, which is the product of an RF power value and an RF duration, but also employ about the same RF power value and about the same RF duration.

Figure 4A:
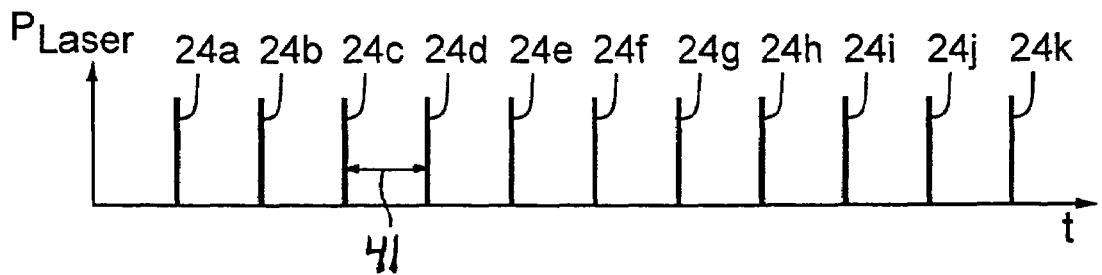
FIGS. 4A-4C are alternative corresponding exemplary timing graphs of laser outputs, RF pulses, and working laser outputs that demonstrate the use of the AOM for energy control of the working laser outputs.
Figure 4B:
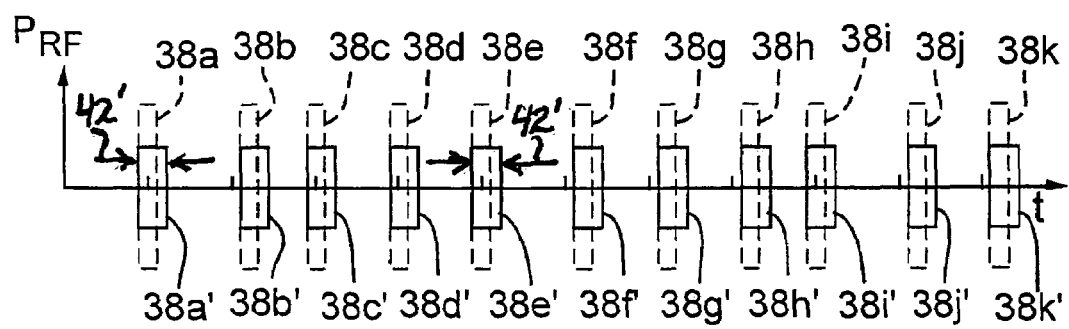
Figure 4C:
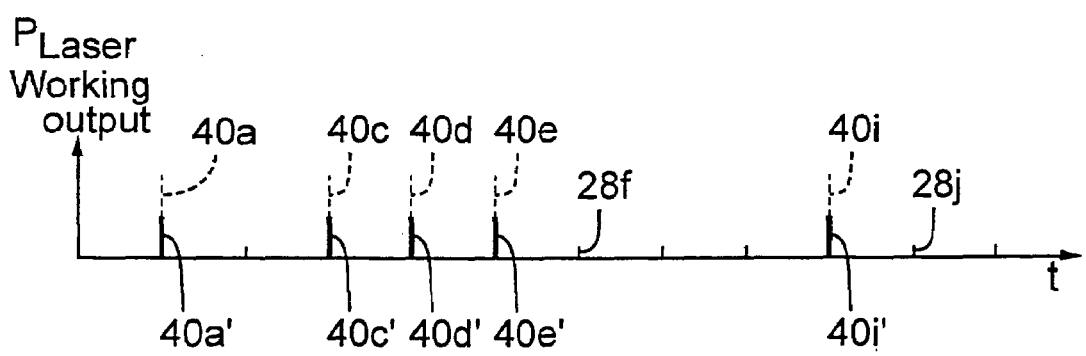

FIGS. 4A-4C (collectively, FIG. 4) show corresponding timing graphs of laser outputs 24, RF pulses 38 applied to AOM 10, and working laser outputs 40 that demonstrate how AOM 10 can be additionally employed to control the output power of working laser outputs 40. FIG. 4A is identical to FIG. 3A and is shown for convenience only. FIGS. 4B and 4C show RF pulses 38 and working laser outputs 40', with the corresponding RF pulses 38 and working laser outputs 40 shown superimposed on them in dashed lines for convenience. The energy values of working laser outputs 40' are attenuated by applying less RF power to AOM 10 for RF pulses 38' than for RF pulses 38; however, RF pulse durations 42' are increased for RF pulses 38' over the RF durations 42 employed for RF pulses 38 to maintain a substantially constant product of RF power value and RF duration to maintain a substantially constant thermal loading on AOM 10. This permits on-demand selection for a continuum of output powers between working laser outputs 40 or 40' without substantial variance in thermal loading on AOM 10. Skilled persons will appreciate that the RF power values and RF durations 42 of the noncoincident RF pulses 38 can be kept as original or can be altered to be within a specified tolerance of the RF loading variation of the coincident RF pulses 38'.

RF pulse duration 42' is preferably selected from about one microsecond to about one-half of laser output interval 41, more preferably shorter than 30 percent of laser output interval 41. For example, if the laser repetition rate is 50 KHz and laser output interval 41 is 20 microseconds, RF pulse duration 42' can be anywhere between one microsecond and ten microseconds. The minimum RF pulse duration 42 or 42' is determined by the laser pulse jittering time and the response time of AOM 10. It is preferable to initiate corresponding ones of RF pulses 38 and 38' surrounding the mid points of laser outputs 24. Likewise, it is preferable for RF pulses 38 and 38' to be delayed or offset about one-half of the minimum RF pulse duration from the initiation of corresponding laser outputs 24.

Figure 5A:
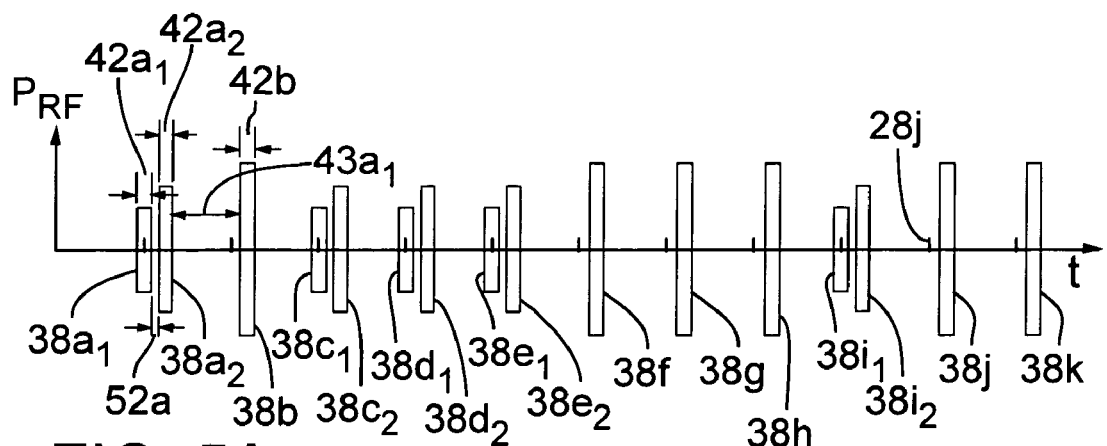
FIGS. 5A and 5B are alternative corresponding exemplary timing graphs of RF pulses and working laser outputs that demonstrate the dynamic control range of working laser output energy afforded by the AOM.
Figure 5B:
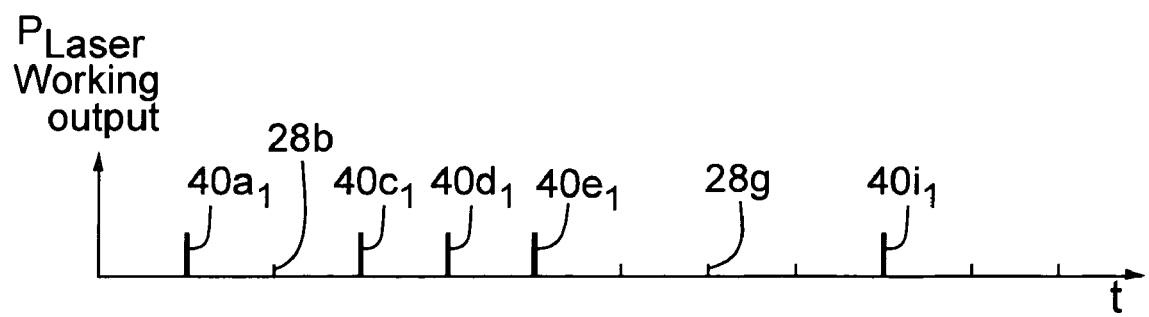

FIGS. 5A and 5B (collectively, FIG. 5) show alternative corresponding timing graphs for RF pulses 38 and working laser outputs 40 that demonstrate a large dynamic control range of the working laser output energy.

With reference to FIGS. 4A and 5, a very low energy working laser output $40a_1$ can be generated by applying an RF pulse $38a_1$ of a near minimum of RF power sufficient to permit targeted propagation of working laser output $40a_1$. An RF pulse duration $42a_1$ coincident with laser output 24a may be kept short to minimize variations in RF pulse intervals 43, and one or more additional noncoincident RF pulses $38a_2$ having higher RF power, but also a short RF pulse duration $42a_1$, may be applied to AOM 10 such that the sum of the RF energy loading for RF pulses $38a_1$ and $38a_2$ substantially equals that of RF pulse 38b. In a preferred embodiment, the offset time 52a between RF pulses $38a_1$ and $38a_2$ can be from zero to a few microseconds. Skilled persons will appreciate that RF pulses $38a_1$ and $38a_2$ can be merged into a single RF pulse 38 that ramps up the RF power after laser output 24a is completed. Skilled persons will also appreciate that RF pulse $38a_2$ may precede RF pulse $38a_1$ instead of follow it. Skilled persons will appreciate that due to the thermal inertia of AOM 10, small differences in RF interval $43a_1$ and RF intervals 43 will not cause any meaningful thermal loading variation from the point of view of deterioration of the laser beam quality and pointing accuracy. Accordingly, the RF interval 43a can be kept sufficiently similar to RF intervals 43 to maintain variations in thermal loading on AOM 10 within a preassigned operational tolerance. The original noncoincident RF pulse 38b can be maintained at its original RF pulse duration 42b and RF power value or it can be modulated in the same manner as the set of RF pulses $38a_1$ and $38a_2$.

Figure 6A:
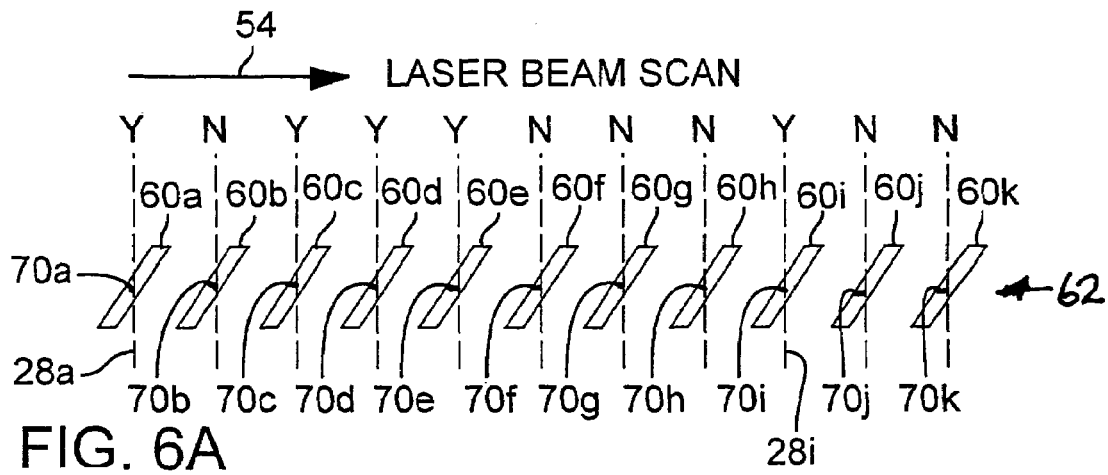
FIGS. 6A-6C are isometric representations of exemplary memory link row structures with corresponding beam positions and a timing graph for showing how working laser outputs may be randomly demanded for a link processing application.
Figure 6B:
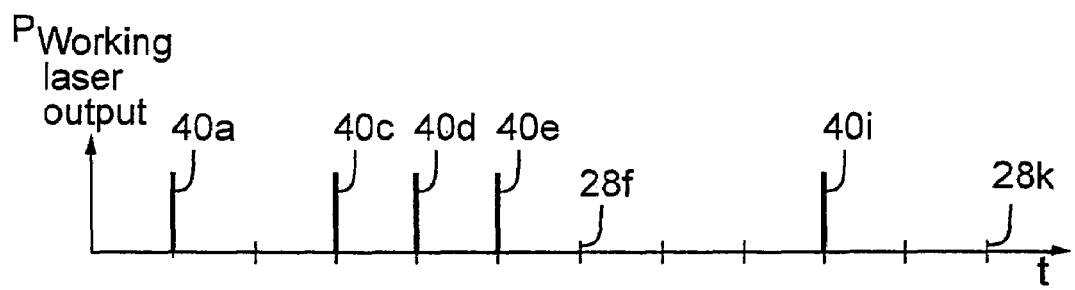
Figure 6C:
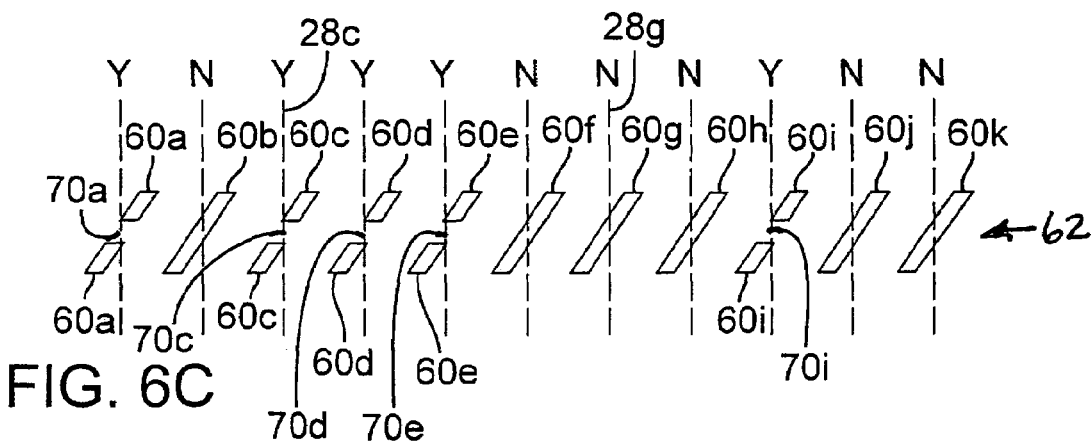

FIGS. 6A-6C (collectively, FIG. 6) show timing graphs of the target alignment position 70 (also scanning position 70) (FIG. 7) and the working laser outputs 40 during an exemplary laser micromachining process, such as laser processing of electrically conductive links 60a-60k (generically links 60). FIG. 6A shows a typical link bank 62 having evenly spaced links 60 that are crossed in a scan direction 54 by a targeting alignment position 70 of a beam positioning system. Based on the results of chip testing, the positioning system is controlled to target randomly positioned links 60 that must be severed to repair an IC device or other workpiece 120 (FIG. 7) while the remaining links 60 remain intact. For example, the scan speed of the beam positioning system can be set to be constant or can be controlled and variable such that the target alignment position 70 crosses over each link 60 at substantially constant positioning intervals, and a laser 126 (FIG. 7) fires laser outputs at a substantially constant interval, which equals the positioning interval. Thus, with the right timing coordination, whenever position 70 crosses over a link 60, a laser output 24 (FIG. 3A) is fired. For convenience, the links 60a, 60c, 60d, 60e, and 60i are designated for severing such that FIG. 6B, which depicts working laser outputs 40, can be identical to FIG. 3C. The working laser outputs 40a, 40c, 40d, 40e, and 40i, therefore, impinge links 60a, 60c, 60d, 60e, and 60i. FIG. 6C shows links 60a, 60c, 60d, 60e, and 60i after they have been severed. The laser outputs 24 are fired in synchronization with the scanning position 70 and at the same constant interval such that each working laser output 40 would hit one link 60. Thus, with the help of the laser pulse picking or gating AOM 10, whenever a link 60 is selected for removal, AOM 10 transmits the laser output 24 to sever link 60 as working laser output 40. Whenever a link 60 is not selected, the AOM 10 does not transmit the laser output 24 so the link 60 remains intact. In this manner, laser 126 is running at a substantially constant repetition rate and laser outputs 24 have a substantially constant output interval 41, but working laser outputs 40 occur at random integer multiple intervals of laser output interval 41.

FIG. 7 shows, as an example, a IC chip link severing system 110 employing RF loading control on AOM 10 to provide stable pulse-to-pulse UV laser energy on demand for processing unevenly spaced links with undistorted working laser output 40. In system 110, a system control computer 112 and an embedded control computer 114 co-act to control a beam position controller 116 that receives position information from an X-Y positioner 118 that positions a workpiece 120 relative to a target alignment position 70 of a working laser output 40. Working laser output 40 may propagate through various optical elements (not shown) in addition to the fold mirror that is shown. X-Y positioner 118 may also include a Z positioner 123 that may be coupled to either the X or Y stage. X-Y positioner 118 is preferably based on a positioning system described in U.S. Pat. No. 5,751,585 for HIGH SPEED, HIGH ACCURACY MULTI-STAGE TOOL POSITIONING SYSTEM, which is assigned to the assignee of this patent application.

In one embodiment, a UV laser subsystem 124, preferably includes a Q-switched solid state IR laser 126, such as a diode-pumped, acousto-optically Q-switched Nd:YVO$_4$ laser; an AOM 10 for picking or gating and amplitude modulating the laser output of IR laser 126; and a frequency multiplier 130 for converting the infrared wavelength emissions from IR laser 126 into green and/or UV wavelengths by employing well-known second, third, or fourth harmonic conversion processes. AOM 10 may be alternatively positioned after frequency multiplier 130 as indicated by the position of an AOM 10a (generically AOM 10) shown in phantom lines. In either embodiment, a laser controller 134 controls the transmissivity of AOM 10 to transmit or block the laser pulses from the laser 126 to propagate working laser outputs 40 on demand toward workpiece 120.

System control computer 112 conveys across a bus 136 into embedded control computer 114 position coordinates of workpiece 120 locations requiring laser processing. In a typical specimen processing application, workpiece 120 includes regularly spaced apart device structures, such as fusible links 60, only some of which require processing. The locations requiring processing are referred to as target locations, and the locations not requiring processing are referred to as intermediate locations. Embedded control computer 114 adds to the target location coordinates intermediate location coordinates that are spaced apart to trigger IR laser 126 at nearly equal intervals 41 (FIG. 4A). Embedded control computer 114 conveys the target and intermediate position coordinates one at a time at a predetermined rate across a bus 138 to registers 140 in beam position controller 116 and simultaneously loads control data across a bus 142 to registers 144 in laser controller 134. The predetermined rate controls the movement velocity of X-Y positioner 118, and the control data indicate whether the coordinate location is a target location to be processed and may further include output mode, timing, and amplitude information.

Laser controller 134 operates timers 146 in either an autopulse mode or a pulse-on-target mode. In autopulse mode, timers 146 start in response to the control data in registers 144; and, in the pulse-on-target mode, timers 146 start in response to receiving a position coincidence signal 148 from a comparator 150 in beam position controller 116. Position encoders 152 in beam position controller 116 indicate to comparator 150 the current position of X-Y positioner 118, and when the current position matches the position coordinates stored in registers 140, position coincidence signal 148 is generated indicating that workpiece 120 is properly positioned over a target position or an intermediate position. Accordingly, if workpiece 120 is positioned over a target position, timers 146 simultaneously operate the Q-switch in IR laser 126 and set AOM 10 to a transmissive state by applying an RF pulse 38 (FIG. 4B) with predetermined RF power and RF duration 42 FIG. 5A) to AOM 10 such that a working laser output 40 passes through AOM 10 and hits the target link 60 (FIG. 6C). If workpiece 120 is positioned over an intermediate position, timers 146 operate the Q-switch in IR laser and apply an RF pulse 38 with predetermined RF power and RF duration 44 to AOM 10 only after a predetermined offset 44 (FIG. 3B) from the Q-switch operation. Thus, the RF pulse 38 is in non-coincidence with laser output 24 and no working laser output 40 is gated through.

Since the movement velocity of X-Y positioner 118 is preferably controlled such that the positioner 118 moves over the combination of the targets and intermediate positions at a constant rate, the laser Q-switch is fired at such a constant repetition rate, or in another words, the laser output interval 41 is made substantially equal to position move times. Therefore, the IR laser 126 is operated at a substantially constant repetition rate, or the laser output interval 41 is substantially constant so there is virtually negligible instabilities in laser output 24 and in laser pulse harmonic conversion due to the variation of the laser output interval 41. Further details concerning on demand triggering of AOM 10 can be found in U.S. Pat. No. 6,172,325 for LASER PROCESSING POWER OUTPUT STABILIZATION APPARATUS AND METHOD EMPLOYING PROCESSING POSITION FEEDBACK, which is herein incorporated by reference.

The RF loading control techniques provide nearly constant thermal loading on AOM 10 by applying an RF pulse 38 to AOM 10 in coincidence with laser output 40 when the positioner 118 is over a target or, in another words, when a working laser output 40 is demanded, and by applying an RF pulse 38 with the same RF energy to AOM 10 but in non-coincidence with the laser output 24 when the positioner 118 is over an intermediate position or, in another words, when a working laser output 40 is not demanded. Skilled persons will appreciate that with such substantially constant thermal loading on AOM 10, there are minimal adverse effects by AOM 10 on the quality and positioning accuracy of working laser output 40.

It will be further appreciated that the RF power of the RF pulse 38 on AOM 10 can be adjusted to control the energy of working laser output 40 to meet target processing needs, while the RF duration 42 of the RF pulse 38 can be controlled accordingly to maintain a substantially constant RF energy or arithmetic product of the RF power and the RF duration 42 of the RF pulse 38.

Not all laser processing applications are, however, suitable for operating with a substantially constant laser PRF. As described in the background of the invention section, many applications require randomly timed laser pulse emissions. Unfortunately, when randomly timed, lasers such as IR laser 126 do not emit repeatable laser pulse energies because the amount of pulse energy is dependent on the elapsed time interval since the prior pulse.

A crude but useful analogy of pulsed laser cavity behavior is a capacitor. Energy from a power source, commonly referred to as a pump, 'charges' the laser cavity over time. When a Q-switch signal occurs, the energy stored in the cavity is discharged and the cavity begins to charge again. The amount of energy delivered by the resulting laser pulse is dependent on how long the cavity is allowed to charge. If two Q-switch signals occur within a short time period, the amount of energy delivered by the laser pulse is lower than if the two Q-switch signals are separated by a longer time period. Therefore, without some form of pulse energy control, pulse energy variations of 10 to 20% are possible, which is well outside the typically allowable 5% process window variation.

Accordingly, this invention further provides pulse energy compensation techniques that automatically determine correction factors required for providing predetermined laser pulse energy levels at random pulse timing intervals.

Referring again to FIG. 7, a randomly timed laser system of this invention may be based on IC chip link severing system 110, which includes Q-switched solid state IR laser 126 and AOM 10 to selectively block or unblock the laser beam from reaching workpiece 120. If, however, the workpiece 120 processing application requires laser pulses to be delivered at time intervals that are not integer multiples of a uniform Q-switch signal period, some action needs to be taken to ensure that the energy per pulse is within the desired tolerance. One solution to this is to use one or more 'dummy pulses' preceding a 'working pulse.' A 'dummy pulse' is referred to herein as a laser pulse emitted with AOM 10 blocked, and a 'working pulse' is referred to herein as a laser pulse emitted with AOM 10 unblocked.

Figure 8A:
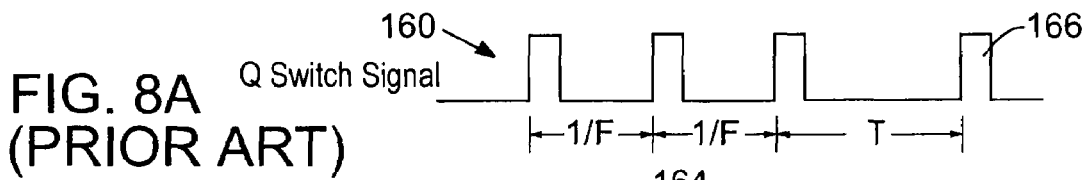
FIGS. 8A and 8B are respective timing graphs of a prior art Q-switch signal and resulting laser pulses emitted at evenly and unevenly spaced time intervals.
Figure 8B:
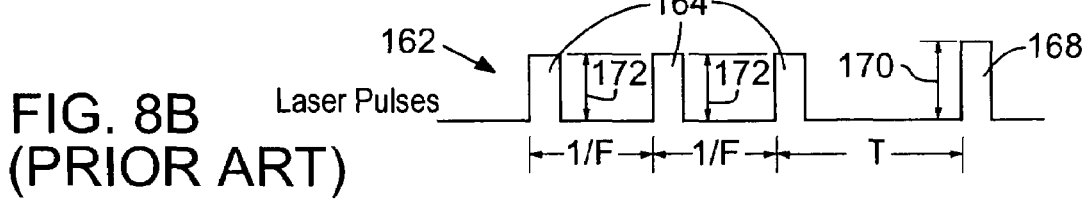

FIGS. 8A and 8B show respective timing graphs of conventional Q-switch signal 160 and resulting laser pulses 162 emitted at evenly spaced time intervals 1/F and an unevenly spaced time interval T. IR laser 126 typically receives Q-switch pulses separated by constant time period 1/F and emits substantially constant energy pulses 164 (either blocked or unblocked). However, IR laser 126 further receives at least one Q-switch pulse 166 separated from the previous one of laser pulses 160 by a time period T that is different from, but preferably greater than 1/F, and less than 2/F for emitting a real pulse 168. Because the amount of energy per pulse increases as time period T between Q-switch signals increases, real pulse 168 has an energy level 170 that is greater than energy levels 172 of constant energy pulses 164.

Figure 9A:
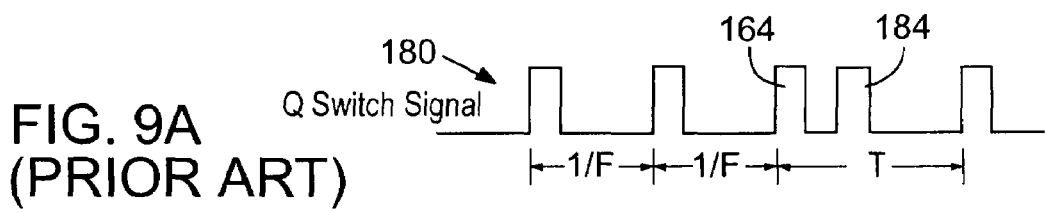
FIGS. 9A and 9B are respective timing graphs of a prior art Q-switch signal and resulting laser pulses emitted in accordance with the spaced time intervals of FIGS. 8A and 8B, and further showing the effect of adding a dummy pulse.
Figure 9B:
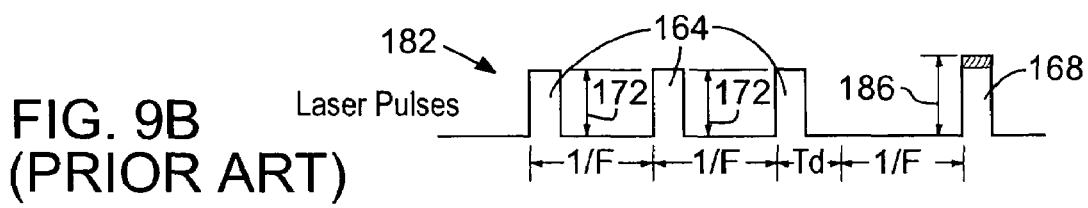

FIGS. 9A and 9B show respective timing graphs of a prior art Q-switch signal 180 and resulting laser pulses 182 emitted in accordance with the spaced time intervals of FIGS. 8A and 8B, and further showing the effect of adding a dummy pulse 184. Adding dummy pulse 184 at a time period 1/F before real pulse 168 should cause real pulse 168 to have an energy level 186 that is substantially the same as energy levels 172 of constant energy pulses 164. Ideally, dummy pulse 184 discharges the energy in the laser cavity and allows the laser to charge back to the required energy value in time period 1/F. Because AOM 10 blocks the laser pulse triggered by dummy pulse 184, the laser pulse energy is prevented from reaching workpiece 120 (FIG. 7).

While suitable for some workpiece processing applications, experiments have shown that there are secondary effects in IR laser 126 that contribute to pulse energy errors in real pulse 168. For example, as a time period Td between a constant energy pulse 164 and dummy pulse 184 decreases, energy level 186 of real pulse 168 increases. This effect seems to occur because the energy stored in the laser cavity is not efficiently discharged when time period Td becomes smaller. Energy built up in the cavity during time Td is only partly discharged by dummy pulse 184. As the cavity then charges up in the interval between dummy pulse 184 and real pulse 168, the amount of energy stored in the cavity is greater than desired and energy level 186 of real pulse 168 is greater than expected.

Figure 10A:
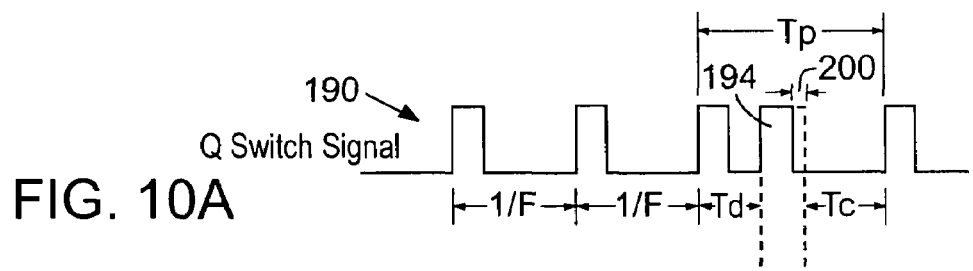
FIGS. 10A and 10B are respective timing graphs of a Q-switch signal and resulting laser pulses of this invention for emitting constant energy level laser pulses by employing the dummy pulse of FIGS. 9A and 9B along with dummy pulse timing considerations of this invention.
Figure 10B:
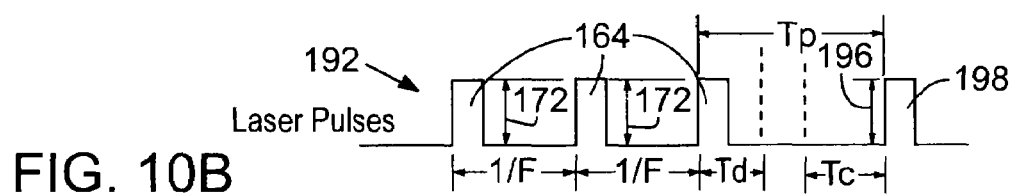

FIGS. 10A and 10B show respective timing graphs of a Q-switch signal 190 and resulting substantially constant energy level laser pulses 192 of this invention by employing a dummy pulse 194 having dummy pulse timing considerations of this invention.

A first preferred solution to the incomplete cavity discharge phenomena entails pulse period compensation, which entails characterizing the incomplete cavity discharge behavior and utilizing that information for adjusting time period Td to compensate for the energy errors. This preferably employs embedded control computer 114 (FIG. 7) for collecting a data set including the relationships among a set of pulse period Tp values and associated sets of energy values 196 and time periods Td associated with generating a real pulse 198. This data set can be used at runtime to determine the time period Td value required for initiating dummy pulse 194 timing that generates a predetermined pulse energy value 196 for each predetermined pulse period Tp value. Preferably, time period Td is selected such that pulse energy value 196 substantially equals energy levels 172 of constant energy pulses 164.

A second preferred solution to the incomplete cavity discharge phenomena entails pulse height compensation, which employs AOM 10 (FIG. 7) for varying an amount of laser energy that is allowed to pass through to workpiece 120 as described above with reference to FIGS. 4 and 5. This preferably entails employing embedded control computer 114 for collecting a data set including the relationships among pulse energy values 196, pulse period Td, and an attenuation level of AOM 10 to set pulse energy level 196 to a predetermined value.

A third preferred solution to the incomplete cavity discharge phenomena employs RF window compensation, which entails providing an extended time period 200 to dummy pulse 194 to allow additional energy to be emitted from the laser cavity whenever dummy pulse 194 is initiated. The additional energy is also blocked by AOM 10. Thereby, dummy pulse 194 includes extended time period 200 for discharging extra energy from the cavity such that a charging time period Tc, the time period between dummy pulse 194 and real pulse 198 results in an energy level 196 of the desired amount, which is preferably substantially the same as energy levels 172.

A fourth preferred solution to the incomplete cavity discharge phenomena employs laser pumping compensation, which entails reducing the pumping current to laser 126 (FIG. 7) prior to the emission of real pulse 168 (FIG. 8B or 9B) or real pulse 198 (FIG. 10B). Selecting a precharacterized pumping current based on pulse timing requirements reduces the rate of energy buildup in the lasing medium such that the emitted real pulse has an energy level 170, 186, or 196 of the desired amount, which is preferably substantially the same as energy levels 172.

An advantage of the above-described techniques is that the laser-based workpiece processing system can automatically determine the laser pulse energy level correction factors required based on internal system timing and laser pulse energy measurements.

Skilled workers will recognize that portions of this invention may be implemented differently from the implementations described above for preferred embodiments. It will be obvious to those having skill in the art that many changes may be made to the details of the above-described embodiments without departing from the underlying principles of the invention. The scope of the present invention should, therefore, be determined only by the following claims.

We claim:

1. A method of forming from laser pulses generated by a Q-switched laser cavity a composite stream of nonuniformly time-displaced laser pulses that include working laser output pulses having working pulse energy values and dummy laser output pulses having dummy pulse energy values, wherein the working laser output pulses are laser pulses whose propagation to a workpiece is permitted by a gating device in an unblocking state and wherein the dummy laser output pulses are laser pulses whose propagation to the workpiece is prevented by a gating device in a blocking state; at least some consecutive ones of the working laser output pulses being mutually uniformly time displaced from one another and having substantially constant working pulse energy values; and some of the dummy laser output pulses causing, for associated nearest successive ones of the working laser output pulses, variations of their working pulse energy values from the substantially constant working pulse energy values, comprising: determining effects of incomplete cavity energy discharge resulting from interaction of certain ones of the working laser output pulses and associated ones of the dummy laser output pulses on the variations from the working pulse energy values of the associated nearest successive ones of the working laser output pulses; introducing laser output pulse compensation in amounts sufficient to offset the effects of incomplete cavity energy discharge contributed by the dummy laser output pulses to limit within a preassigned operational tolerance the variations from the substantially constant working pulse energy values; and selectively gating the composite stream of nonuniformly time-displaced laser pulses to exclude the dummy laser output pulses and thereby provide a stream of nonuniformly time-displaced working laser output pulses having working pulse energy values with variations that are limited within the preassigned operational tolerance.

2. The method of claim 1, in which each of the dummy and its associated nearest successive working laser output pulses has a start time, and in which the dummy laser output pulse compensation includes introducing between the start times of given dummy laser output pulses and their nearest neighboring working laser output pulses an individually variable delay that diminishes the interaction to an amount that establishes within the preassigned operational tolerance pulse energy values for the associated nearest successive ones of the working laser output pulses.

3. The method of claim 1, in which the laser output pulse compensation includes, by operation of the selective gating of the composite stream of nonuniformly time-displaced laser pulses, individually selectively setting the working pulse energy values of some of the associated nearest successive ones of the working laser output pulses to values with variations that are within the preassigned operational tolerance.

4. The method of claim 1, in which the nonuniformly time-displaced working laser output pulses have a first energy versus time profile and at least one of the dummy laser output pulses has a second energy versus time profile that is different from the first energy versus time profile.

5. The method of claim 1, in which at least two of the dummy laser output pulses have different energy versus time profiles.

6. The method of claim 1, in which associated ones of the dummy laser output pulses are triggered at predetermined times to cause the associated nearest successive ones of the working laser output pulses to have first energy levels, and in which the associated ones of the dummy laser output pulses have second energy levels, the method further including:

determining a relationship data set associating sets of individually variable first energy levels, second energy levels, and predetermined times; and selecting the predetermined times from the relationship data set.

7. The method of claim 1, in which associated ones of the dummy laser output pulses are triggered at predetermined times to cause the associated nearest successive ones of the working laser output pulses to have first energy levels, and in which the associated ones of the dummy laser output pulses have second energy levels, and in which the selectively gating further includes attenuating the energy levels of the associated nearest successive ones of the working laser output pulses by an attenuation factor, the method further including:

determining a relationship data set associating sets of individually variable second energy levels, attenuation factors, and predetermined times; and selecting from the relationship data set at least one of the predetermined times and attenuation factors that cause the second energy levels to substantially equal the first energy levels.

8. The method of claim 7, in which the selectively gating and attenuating are carried out by an acousto-optic modulator or an electro-optic modulator.

9. The method of claim 1, in which the laser output pulse compensation includes reducing pumping current delivered to the Q-switched laser cavity prior to emission of the associated nearest successive ones of the working laser output pulses.

10. The method of claim 1, in which the Q-switched laser cavity is part of a Q-switched solid state laser.

11. The method of claim 1, in which the selectively gating the composite stream is carried out by an acousto-optic modulator or an electro-optic modulator.

12. The method of claim 1, in which the working laser output pulses impinge severable links.

13. The method of claim 1, in which the selectively gating includes operating a gating device in noncoincidence with, and temporal proximity to, the dummy laser output pulses to reduce adverse effects associated with thermal load variation on the gating device.

14. A method of forming from laser pulses generated by a Q-switched laser cavity a stream of selectively nonuniformly time-displaced working laser output pulses having substantially constant pulse energies, wherein the working laser output pulses are laser pulses whose propagation to a workpiece is permitted by a gating device in an unblocking state, comprising: inserting dummy laser output pulses in a stream of selectively nonuniformly time-displaced working laser output pulses to form a composite stream of selectively nonuniformly time-displaced laser pulses emitted by the laser cavity, wherein the dummy laser output pulses are laser pulses whose propagation to the workpiece is prevented by a gating device in a blocking state, the dummy laser output pulses having characteristics that determine their energy versus time profiles; introducing individualized dummy laser output pulse compensation to limit within a preassigned operational tolerance laser working output pulse energy variation error caused by cavity energy discharge anomalies stemming from interaction of the dummy laser output pulses and their corresponding nearest neighboring working laser output pulses in the stream of selectively nonuniformly time-displaced working laser output pulses, the dummy laser output pulse compensation including setting at least one of the characteristics of at least one of the dummy laser output pulses to a selectable value that causes cavity energy discharge sufficient to provide a desired pulse energy for a next succeeding working laser output pulse occurring after the dummy laser output pulse, such that the selectively nonuniformly time-displaced working laser output pulses have a first energy versus time profile and at least one of the dummy laser output pulses has a second energy versus time profile that is different from the first energy versus time profile; and selectively gating the composite stream of selectively nonuniformly time-displaced laser pulses to prevent inclusion of the dummy laser output pulses in the stream of selectively nonuniformly time-displaced working laser output pulses and thereby provide a stream of selectively nonuniformly time-displaced working laser output pulses having substantially constant energies.

15. The method of claim 14, in which each of the dummy and its corresponding nearest neighboring working laser output pulses has a start time, and in which the dummy laser output pulse compensation includes introducing between the start times of a given dummy laser output pulse and its corresponding nearest neighboring working laser output pulse an individually variable delay that diminishes the interaction to an amount that establishes within the preassigned operational tolerance a pulse energy for a working laser output pulse occurring after the given dummy laser output pulse.

16. The method of claim 14, in which at least two of the dummy laser output pulses have different energy versus time profiles.

17. The method of claim 14, in which a preceding dummy laser output pulse is triggered at a predetermined time to cause the next succeeding working laser output pulse to have a first energy level, and in which the preceding dummy laser output pulse has a second energy level, the method further including:

determining a relationship data set associating sets of individually variable first energy levels, second energy levels, and predetermined times; and selecting the predetermined time from the relationship data set.

18. The method of claim 14, in which the selectively nonuniformly time-displaced working laser output pulses impinge severable links.

19. The method of claim 14, in which the selectively gating includes operating a gating device in noncoincidence with, and temporal proximity to, the dummy laser output pulses to reduce adverse effects associated with thermal load variation on the gating device.

20. The method of claim 14, in which first working laser output pulses included in a set of first working laser output pulses are separated by a first time period and have a first energy level; in which a second working laser output pulse is separated from the set of first working laser output pulses by a second time period that is greater than, and is not an integer multiple of, the first time period; and in which a dummy laser output pulse is triggered at a predetermined time that causes the second working laser output pulse to have a second energy level that is substantially the same as the first energy level.

21. The method of claim 20, in which the second time period is less than twice the first time period.

22. The method of claim 1, in which first working laser output pulses included in a set of first working laser output pulses are separated by a first time period and have a first energy level; in which a second working laser output pulse is separated from the set of first working laser output pulses by a second time period that is greater than, and is not an integer multiple of, the first time period; and in which a dummy laser output pulse is triggered at a predetermined time that causes the second working laser output pulse to have a second energy level that is substantially the same as the first energy level.

23. The method of claim 22, in which the second time period is less than twice the first time period.

24. A method of forming from laser pulses generated by a Q-switched laser cavity a stream of selectively nonuniformly time-displaced working laser output pulses having substantially constant pulse energies, wherein the working laser output pulses are laser pulses whose propagation to a workpiece is permitted by a gating device in an unblocking state, comprising: inserting dummy laser output pulses in a stream of selectively nonuniformly time-displaced working laser output pulses to form a composite stream of selectively nonuniformly time-displaced laser pulses emitted by the laser cavity, wherein the dummy laser output pulses are laser pulses whose propagation to the workpiece is prevented by a gating device in a blocking state, the dummy laser output pulses having characteristics that determine their energy versus time profiles; introducing individualized dummy laser output pulse compensation to limit within a preassigned operational tolerance laser working output pulse energy variation error caused by cavity energy discharge anomalies stemming from interaction of the dummy laser output pulses and their corresponding nearest neighboring working laser output pulses in the stream of selectively nonuniformly time-displaced working laser output pulses, the dummy laser output pulse compensation including setting at least one of the characteristics of at least one of the dummy laser output pulses to a selectable value that causes cavity energy discharge sufficient to provide a desired pulse energy for a next succeeding working laser output pulse occurring after the dummy laser output pulse, such that at least two of the dummy laser output pulses in the composite stream of selectively nonuniformly time-displaced laser pulses have different selectable values; and selectively gating the composite stream of selectively nonuniformly time-displaced laser pulses to prevent inclusion of the dummy laser output pulses in the stream of selectively nonuniformly time-displaced working laser output pulses and thereby provide a stream of selectively nonuniformly time-displaced working laser output pulses having substantially constant energies.

25. The method of claim 24, in which the selectively gating the composite stream is carried out by an acousto-optic modulator or an electro-optic modulator.

26. The method of claim 14, in which the selectively gating the composite stream is carried out by an acousto-optic modulator or an electro-optic modulator.

* * * * *

UNITED STATES PATENT AND TRADEMARK OFFICE
CERTIFICATE OF CORRECTION

| | | |
|---|---|---|
| PATENT NO. | : 7,616,669 B2 | Page 1 of 1 |
| APPLICATION NO. | : 10/997586 | |
| DATED | : November 10, 2009 | |
| INVENTOR(S) | : Grant et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 784 days.

Signed and Sealed this

Nineteenth Day of October, 2010

David J. Kappos
*Director of the United States Patent and Trademark Office*